(12) United States Patent
Phillips et al.

(10) Patent No.: US 10,557,213 B2
(45) Date of Patent: *Feb. 11, 2020

(54) CRYSTAL GROWING SYSTEMS AND METHODS INCLUDING A TRANSPARENT CRUCIBLE

(71) Applicant: GlobalWafers Co., Ltd., Hsinchu (TW)

(72) Inventors: Richard J. Phillips, St. Peters, MO (US); Soubir Basak, Chandler, AZ (US); Gaurab Samanta, Brentwood, MO (US)

(73) Assignee: GLOBALWAFERS CO., LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/920,796

(22) Filed: Mar. 14, 2018

(65) Prior Publication Data

US 2018/0202065 A1    Jul. 19, 2018

Related U.S. Application Data

(63) Continuation of application No. 15/216,351, filed on Jul. 21, 2016, now Pat. No. 10,066,314.

(60) Provisional application No. 62/195,844, filed on Jul. 23, 2015.

(51) Int. Cl.
*C30B 15/14* (2006.01)
*C30B 15/12* (2006.01)
*C30B 29/06* (2006.01)

(52) U.S. Cl.
CPC .............. *C30B 15/14* (2013.01); *C30B 15/12* (2013.01); *C30B 29/06* (2013.01)

(58) Field of Classification Search
CPC ................................ C30B 15/14; C30B 15/02
See application file for complete search history.

(56) References Cited

U.S. PATENT DOCUMENTS

| | | | |
|---|---|---|---|
| 4,268,842 A | 5/1981 | Jacob et al. | |
| 4,632,686 A | 12/1986 | Brown et al. | |
| 4,935,046 A | 6/1990 | Uchikawa et al. | |
| 6,447,601 B1 | 9/2002 | Phillips et al. | |
| 9,133,063 B2 | 9/2015 | Sudo et al. | |
| 10,066,314 B2 * | 9/2018 | Phillips | C30B 15/14 |
| 2010/0089308 A1 | 4/2010 | Kishi et al. | |

* cited by examiner

*Primary Examiner* — Robert M Kunemund
(74) *Attorney, Agent, or Firm* — Armstrong Teasdale LLP

(57) ABSTRACT

A system for growing a crystal ingot from a melt includes a crucible assembly configured to contain the melt and a susceptor configured to support the crucible assembly. The crucible assembly includes a substantially transparent crucible. The system further includes a heating system for generating thermal energy and disposed to supply thermal energy to the susceptor via thermal radiation. The susceptor enables transfer of thermal energy to the melt via radiation through the transparent crucible.

7 Claims, 3 Drawing Sheets

CRYSTAL GROWING SYSTEMS AND METHODS INCLUDING A TRANSPARENT CRUCIBLE

CROSS REFERENCE TO RELATED APPLICATIONS

This application is a continuation application of U.S. application Ser. No. 15/216,351, which was filed Jul. 21, 2016 now U.S. Pat. No. 10,066,314, and which is hereby incorporated by reference in its entirety. U.S. application Ser. No. 15/216,351 claims the benefit of U.S. Provisional Patent Application 62/195,844, filed Jul. 23, 2015, and which is hereby incorporated by reference in its entirety.

FIELD

The field of the disclosure relates generally to systems and methods for producing ingots of semiconductor or solar material from a melt and, more particularly, to systems and methods for the transfer of heat to the melt.

BACKGROUND

In the production of silicon crystals grown by either the Czochralski (Cz) method or the continuous Czochralski (CCZ) method, polycrystalline silicon is first melted within a crucible, such as a quartz crucible, of a crystal pulling device to form a silicon melt. The puller then lowers a seed crystal into the melt and slowly raises the seed crystal out of the melt. As the seed crystal is grown from the melt, solid polysilicon is added to the melt to replenish the polysilicon that is incorporated into the growing crystal. The addition of polysilicon to the melt reduces the temperature of the melt where the solid polysilicon is added. As a result, additional heat is needed to melt the solid polysilicon, and maintain the melt in a liquid state.

Known crystal pulling devices use external heaters to conductively heat the melt through the crucible. Known crucibles are typically opaque and have a relatively low thermal conductivity. As such, the crucible must be heated to a relatively high temperature to maintain the melt in a substantially liquid state. However, at such high temperatures, carbon from the graphite susceptor, which supports the crucible, and the silica from the quartz crucible react with each other. This reaction generates oxidized carbon and silicon products in gaseous form. The gases get carried away by the flowing inert gases within the puller system and deposited into the silicon melt, thus contaminating the melt with carbon. Silicon crystals grown from this melt, then, have a high carbon content and may potentially lead to silicon wafers that are out of specification. Furthermore, because the gaseous reaction products are being carried away by the inert gases in the crystal puller, the exterior surfaces of the growing ingot are exposed to the gaseous reaction products and may react further. This leads to continuous contamination of the silicon melt.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, a system for growing a crystal ingot from a melt is provided. The system includes a susceptor and a crucible assembly supported by the susceptor and configured to contain the melt. The crucible assembly includes a crucible that is substantially transparent and a heating system for generating thermal energy and disposed to supply thermal energy to the susceptor via thermal radiation. The susceptor enables transfer of thermal energy to the melt via radiation through the transparent crucible wherein a percent of the total thermal radiation supplied to the susceptor and transferred through the crucible is between approximately 80% and approximately 92%.

In another aspect, a crucible assembly for use in a system for growing a crystal ingot from a melt is provided. The system includes a susceptor and a heating system. The crucible assembly includes a crucible having a base wall and a sidewall such that the crucible is configured to contain the melt, wherein the crucible is substantially transparent. The heating system generates thermal energy to supply to the susceptor via thermal radiation. The susceptor enables transfer of thermal energy to the melt via radiation through the transparent crucible wherein a percent of the total thermal radiation supplied to the susceptor and transferred through the crucible is between approximately 80% and approximately 92%.

In yet another aspect, a method of growing a crystal ingot from a melt is provided. The method includes providing a susceptor and supporting a crucible with the susceptor. The crucible is configured to contain the melt, wherein the crucible is substantially transparent. The method also includes generating thermal energy via a heating system and supplying the thermal energy to the susceptor via thermal radiation. The susceptor enables transfer of thermal energy to the melt via radiation through the transparent crucible, wherein a percent of the total thermal radiation supplied to the susceptor and transferred through the crucible is between approximately 80% and approximately 92%.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Figure 1:
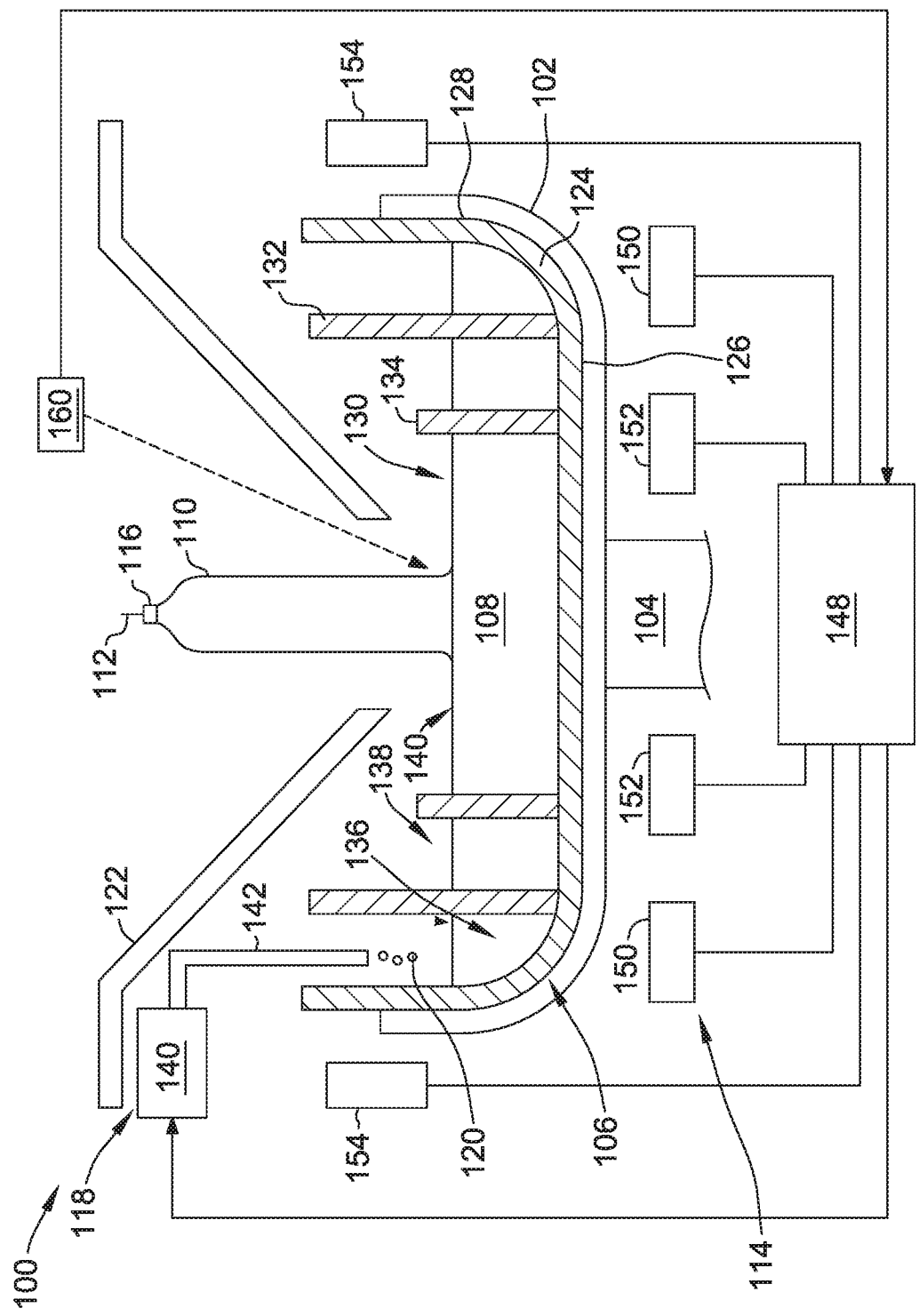
FIG. 1 is a cross-section of one embodiment of a crystal growing system.

Referring to FIG. 1, a crystal growing system is shown schematically and is indicated generally at 100. The crystal growing system 100 is used to produce crystal ingots by a continuous Czochralski (CCz) method. As discussed herein, the system is described in relation to the continuous Czochralski method of producing single crystal ingots, though a batch process using the Czochralski (Cz) method may be used.

The crystal growing system 100 includes a susceptor 102 supported by a rotatable shaft 104, a crucible assembly 106 that contains a silicon melt 108 from which an ingot 110 is being pulled by a puller 112, and a heating system 114 for supplying thermal energy to the system 100 and maintaining the melt 108. During the crystal pulling process, a seed crystal 116 is lowered by the puller 112 into the melt 108 and then slowly raised from the melt 108. As the seed crystal 116 is slowly raised from the melt 108, silicon atoms from the melt 108 align themselves with and attach to the seed crystal 116 to form the ingot 110.

The system 100 also includes a feed system 118 for feeding solid feedstock material 120 into the crucible assembly 106 and/or the melt 108, and a heat shield 122 configured to shield the ingot 110 from radiant heat from the melt 108 to allow the ingot 110 to solidify.

In the example embodiment, the crucible assembly 106 includes a substantially transparent crucible 124 having a base 126 and a generally annular sidewall 128 extending around the circumference of the base 126. Together, the base 126 and sidewall 128 define a cavity 130 of the crucible 124 within which the melt 108 is disposed. The crucible 124 may be constructed of any suitable material that enables system 100 to function as described herein, including, for example, quartz.

The crucible assembly 106 also includes a plurality of weirs 132, 134 that separate the melt 108 into different melt zones. In the example embodiment, at least one of the weirs 132, 134 is also substantially transparent, as is the crucible 124. Specifically, a percent of the total thermal radiation transferred through the plurality of weirs is between approximately 80% and approximately 92%. Alternatively, the weirs 132, 134 are substantially opaque. In the illustrated embodiment, the crucible assembly 106 includes a first weir 132 separating an outer melt zone 136 of the melt 108 from an inner melt zone 138 of the melt 108, and a second weir 134 at least partially defining a growth zone 139 from which the ingot 110 is pulled. The first weir 132 and the second weir 134 each have a generally annular shape, and have at least one opening defined therein to permit the melt 108 to flow radially inwards towards the growth zone 139. The first weir 132 and the second weir 134 are disposed within the cavity 130 of crucible 124, and create a circuitous path from the outer melt zone 136 to the inner melt zone 138 and the growth zone 139. The weirs 132, 134 thereby facilitate melting solid feedstock material 120 before it reaches an area immediately adjacent the growing crystal (e.g., the growth zone 139). The weirs 132, 134 may be constructed from any suitable material that enables the system 100 to function as described herein, including, for example, quartz. While the illustrated embodiment is shown and described as including two weirs, the system 100 may include any suitable number of weirs that enables the system 100 to function as described herein, such as such as one weir, three weirs, and four weirs.

In other embodiments, one or more weirs do not include openings. In these embodiments, movement of the melt 108 from the outer melt zone 136 to the inner melt zone 138 and/or the growth zone 139 is limited to movement above or below the weirs. In yet other embodiments, the crucible assembly 106 may include more than one crucible. For example, the crucible assembly may include a second crucible (not shown) positioned within the cavity 130 of the crucible 124 to separate the melt 108 into one or more melt zones.

The crucible 124, the first weir 132, and the second weir 134 may be formed separately from one another, and assembled to form the crucible assembly 106. In other suitable embodiments, the crucible assembly 106 may have a unitary construction. That is, the crucible 124 and one or both weirs 132, 134 may be integrally formed (e.g., formed from a unitary piece of quartz).

The feed system 118 includes a feeder 140 and a feed tube 142. Solid feedstock material 120 may be placed into the outer melt zone 136 from feeder 140 through feed tube 142. The amount of feedstock material 120 added to the melt 108 may be controlled by a controller (such as the controller 148, described below) based on a temperature reduction in the melt 108 resulting from the cooler feedstock material 120 being added to the melt 108.

The heat shield 122 is positioned adjacent the crucible assembly 106, and separates the melt 108 from an upper portion of the system 100. The heat shield 122 is configured to shield the ingot 110 from radiant heat generated by the melt 108 and the heating system 114 to allow the ingot 110 to solidify. In the example embodiment, the heat shield 122 includes a conical member separating the melt 108 from an upper portion of the system 100, and a central opening defined therein to allow the ingot 110 to be pulled therethrough. In other embodiments, the heat shield 122 may have any suitable configuration that enables the system 100 to function as described herein. As noted above, the heat shield 122 shields the ingot 110 from radiant heat generated by the melt 108 and the heating system 114 to allow the ingot 110 to solidify. In the illustrated embodiment, the heat shield 122 also inhibits line-of-sight projectiles from reaching the inner melt zone 138 during the addition of solid feedstock material 120, and at least partially inhibits gas flow in a radially inwards direction towards the inner melt zone 138. In the example embodiment, the heat shield 122 is constructed from graphite. In other embodiments, the heat shield 122 may be constructed from any suitable material that enables the system 100 to function as described herein, including, for example, silica-coated graphite, high purity molybdenum, and combinations thereof.

The heating system 114 configured to melt an initial charge of solid feedstock (such as chunk polysilicon), and maintain the melt 108 in a liquefied state after the initial charge is melted. The heating system 114 includes a plurality of heaters 150, 152, and 154 arranged at suitable positions about the crucible assembly 106. In the illustrated embodiment, the heaters 150, 152, and 154 have a generally annular shape, and heaters 150, 152 are positioned beneath the crucible 124 and the susceptor 102, while heaters 154 are positioned adjacent the sidewall 128 of the crucible 124. More specifically, the heaters 150, 152 are positioned proximate an outer surface of the base 126 of the crucible and the susceptor 102. The heaters 150, 152, and 154 are thus configured to supply heat to the melt 108 by conduction through the susceptor 102 and the base 126 and the sidewalls 128 of the crucible 124. In the example embodiment, the transparent crucible 124 allows energy to pass therethrough and therefore transfers energy from the heaters 150, 152, and 154 to the melt 108 by allowing heat energy in the susceptor 102, imparted thereon by the heaters 150, 152, and 154, to radiate through the crucible 124 to the melt 108.

In the example embodiment, the heaters 150, 152, and 154 are resistive heaters, although the heaters 150, 152, and 154 may be any suitable heating device that enables system 100 to function as described herein. Further, while the illustrated embodiment is shown and described as including three heaters 150, 152, and 154 the system 100 may include any suitable number of heaters that enables the system 100 to function as described herein.

The heaters 150, 152, and 154 are connected to a controller 148. The controller 148 controls electric current provided to the heaters 150, 152, 154 to control the amount of thermal energy supplied by heaters 150, 152, 154. The amount of current supplied to each of the heaters 150, 152, 154 by controller 148 may be separately and independently chosen to optimize the thermal characteristics of the melt 108. In the illustrated embodiment, the controller 148 also controls feed system 118 and the delivery of feedstock material 120 to the melt 108 to control the temperature of the melt 108.

A sensor 160, such as a pyrometer or like temperature sensor, provides a continuous measurement of the temperature of melt 108 at the crystal/melt interface of the growing single crystal ingot 110. Sensor 160 also may be configured to measure the temperature of the growing ingot 110. Sensor 160 is communicatively coupled with controller 148. Additional temperature sensors may be used to measure and provide temperature feedback to the controller 148 with respect to other areas of the melt 108 that are relevant to the melting of the feedstock material 120 or in controlling the growing ingot 110. While a single communication lead is shown for clarity, one or more temperature sensor(s) may be linked to the controller 148 by multiple leads or a wireless connection, such as by an infra-red data link or another suitable means.

During either the CCz or the Cz method of producing crystal ingots, the heating system 114 supplies thermal energy to the melt 108 by conduction through the susceptor 102 and the crucible 124. When an opaque crucible is used in either the CCz or the Cz method thermal energy generated by the heaters is transferred to the melt primarily by conduction through the susceptor and the crucible. In known pulling systems, as described above, the high temperature quartz and the graphite may react to produce a gaseous product that may contaminate the silicon melt and/or the newly formed silicon ingot.

In this embodiment, the crucible 124 is manufactured from a transparent or substantially transparent (translucent) quartz material that substantially maintains transparency throughout the entire crystal growth cycle. Furthermore, the susceptor is manufactured from graphite material. The transparent crucible 124 has a relatively high thermal conductivity because heat from the heaters 150, 152, and 154 is transmitted directly through the bottom wall 126 and sidewall 128 of the crucible 124 rather than being absorbed into the bottom and sidewalls, as is the case with an opaque crucible. As such, heat transfer to the melt 108 is mostly by radiation through the transparent crucible. In this embodiment, the crucible 124 reaches a temperature that is lower than a temperature of an opaque crucible, as described in further detail below, while still allowing the silicon melt 108 to liquefy. In fact, because the crucible 124 absorbs a reduced amount of heat from heaters 150, 152, and 154, more heat energy reaches the melt 108 and the melt 108 may reach its predetermined desired temperature in a shorter period of time, thus facilitating faster ingot formation.

Opacity of known crucibles is due to a high concentration of bubbles formed in the quartz material that cause scattering of light and heat. In this embodiment, having the transparent crucible 124, the concentration of bubbles is very low in comparison such that scattering of light and heat is minimized. As described herein, the transparency of the crucible 124 is persistent during heating. The substantially transparent crucibles may be manufactured, for example, by arc fusion or tube draw processes.

By reducing the temperature of the crucible 124, the reaction between the quartz crucible 124 and the graphite susceptor 102 slows, and, thus, fewer reaction products are formed by the reaction. As such, it is possible to suppress the formation of the gaseous components, thus reducing potential carbon contamination in the puller environment. In one embodiment, the sidewalls 128 and the bottom wall 126 are formed from a highly transparent material, such as, but not limited to, quartz (SiO2) such that heat transfer through the crucible 124 is dominated by radiation.

The degree of transparency is the most significant material attribute to be controlled. Transparency is measured as a percentage. That is, in this embodiment, transparency is defined as:

$$\% \; T = \frac{\text{Transmitted Light}}{\text{Incident Light}} * 100\%$$

The most preferred level of transmission of thermal radiation heat energy through the crucible 124 is 100%. However, scattering of the heat energy due to surface reflection for smooth surfaces may reduce the transmission by 4% per surface. For example, a portion of the heat energy impinging an outer surface 124a (shown in FIG. 2) of the crucible 124 and a portion of the energy impinging an inner surface 124b (shown in FIG. 2) of the crucible 124 may scatter such that the entire amount of energy is transferred through the crucible 124. As such, in this embodiment, a high temperature anti-reflection coating 125 (shown in FIG. 2) is applied to at least one of surfaces 124a and 124b to facilitate a transmission rate in a range of between approximately 90% to approximately 100%. In another embodiment where coating 125 is not used, the energy transmission rate ranges between approximately 80% to approximately 92%. Generally, a percent of the total thermal radiation supplied to the susceptor and transferred through the crucible is between approximately 80% and approximately 100%. More specifically, a percent of the total thermal radiation supplied to the susceptor and transferred through the crucible is between approximately 90% and approximately 100%.

Figure 2:
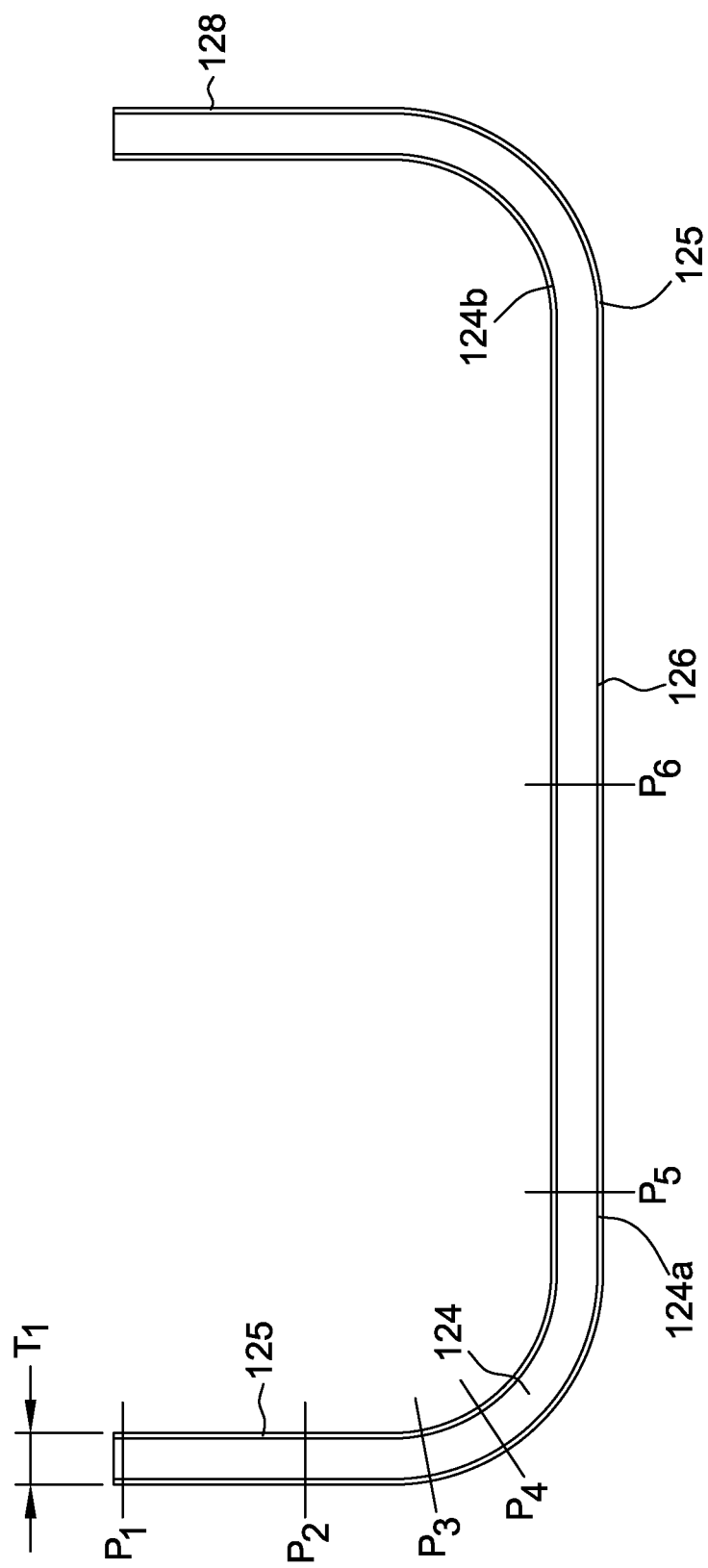
FIG. 2 is an enlarged view of FIG. 1 illustrating details of a crucible that may be used with the crystal growing system shown in FIG. 1.

FIG. 2 is a cross-sectional view illustrating details of an exemplary crucible 124 that may be used with the crystal growing system 100 shown in FIG. 1. FIG. 2 illustrates anti-reflective coating 125 and also outer surface 124a and inner surface 124b. Also shown in FIG. 2 are a plurality of points P1-P6 illustrating various locations on the crucible 124 where temperature readings are taken during the crystal pulling process, as described in Table 1 below.

TABLE 1

| Location | T opaque (°K) | T transparent (°K) | T opaque (° C.) | T transparent (° C.) | T Difference (Opaque vs Transparent) |
|---|---|---|---|---|---|
| P1 | 1660 | 1640 | 1387 | 1367 | 20 |
| P2 | 1840 | 1740 | 1567 | 1467 | 100 |
| P3 | 1840 | 1750 | 1567 | 1477 | 90 |
| P4 | 1760 | 1720 | 1487 | 1147 | 40 |
| P5 | 1710 | 1680 | 1437 | 1407 | 30 |
| P6 | 1680 | 1675 | 1407 | 1402 | 5 |

Table 1 above compares the temperature and common locations of a known opaque crucible and the exemplary transparent crucible 124. The opaque crucible and the transparent crucible 124 have the same wall thickness T1. For example, in the test performed to gain the data in Table 1, each crucible has a wall thickness of 12 millimeters (mm). The crucible 124 includes a wall thickness T1 within a range of between approximately 10 mm to approximately 18 mm. Alternatively, crucible 124 may have any thickness that facilitates operation of crucible 124 as described herein. More specifically, it is expected that a thicker transparent wall would reduce the difference in temperature, and likewise, a thinner transparent wall would increase the difference relative to the opaque crucible. However, this effect from the wall thickness is modeled to be approximately 10 times less the effect of the transparency. By reducing the wall thickness, it is possible to allow the crucible 124 to become press formed against the susceptor 102, thus closing a gap defined therebetween. Specifically, during heating, the pressure of the melt and the crucible itself can allow a force which will cause the crucible to deform outward into the susceptor.

As shown in Table 1, temperature reductions by as much as 100 degrees Celsius (° C.) in some locations of the crucible 124 result from the transparency of the bottom wall 126 and the sidewall 128.

Figure 3:
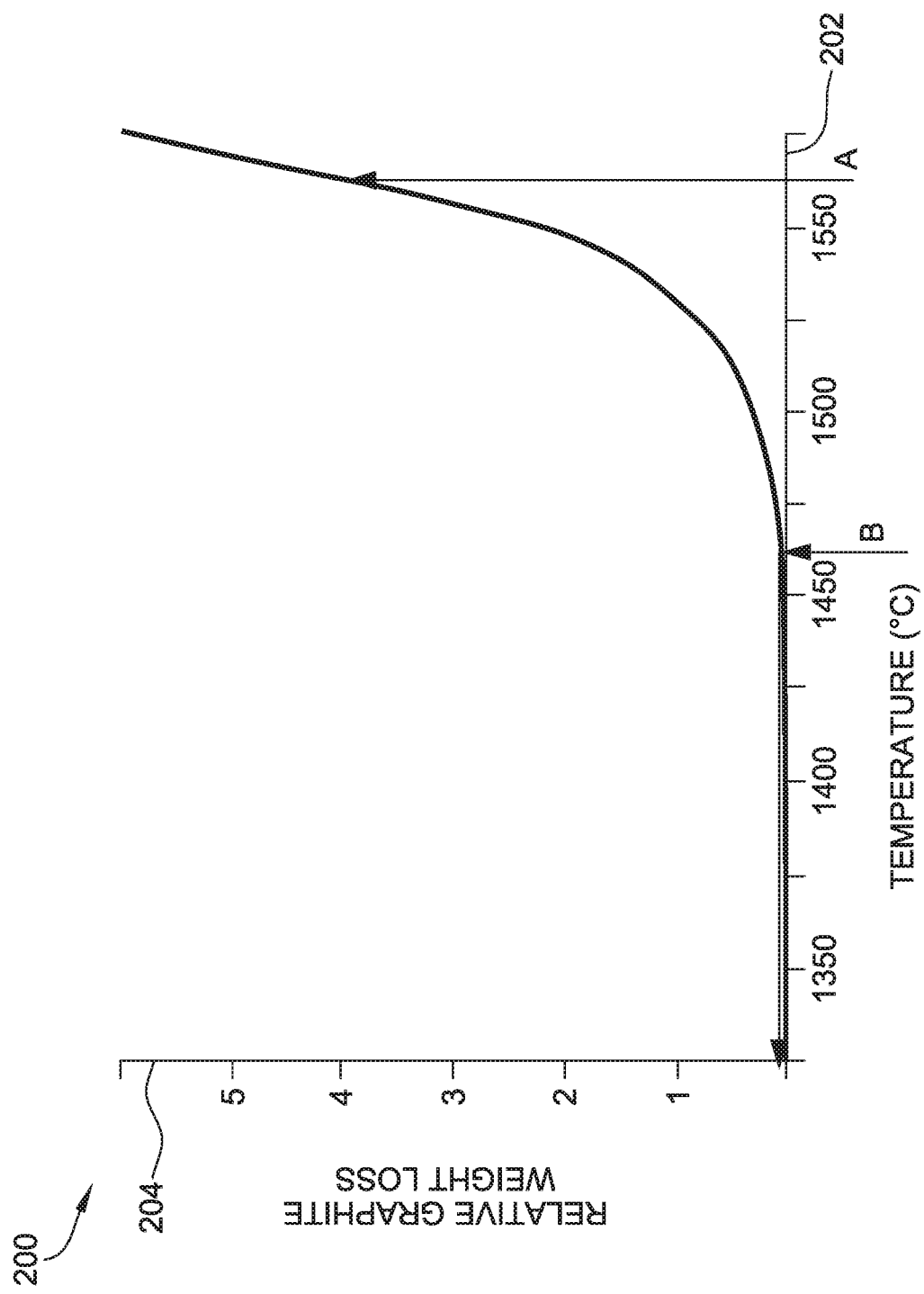
FIG. 3 is a graph illustrating relative graphite weight loss versus temperature of the crucible shown in FIG. 2.

FIG. 3 is graphical plot 200 illustrating relative graphite weight losses during the crystal pulling process versus temperature of the crucible shown in FIG. 2. Plot 200 includes an x-axis 202 of crucible temperature and a y-axis 204 of relative graphite weight loss of the susceptor 1-2 as a percentage of total susceptor weight. Plot 200 also includes a curve 206 representing the relative weight loss of graphite as a function of crucible temperature. Curve 206 was determined experimentally and illustrates that as the temperature of the crucible exceeds approximately 1500° C., the relative graphite weight loss in the susceptor increases exponentially. Accordingly, the higher the temperature of the crucible during the crystal pulling process, the more the graphite of the susceptor reacts with the crucible to produce gaseous contaminants. As such, it is desirable to reduce the temperature of the crucible while maintaining the melt at a predetermined temperature.

Referring to the plot 200, Point A along the x-axis 202 represents the operational temperature of a known opaque crucible. More specifically, Point A is located at approximately between 1560° C. and 1565° C. At such a temperature, the corresponding relative graphite weight loss on the y-axis 204 is approximately 4 relative mass units. Point B represents the operational temperature of the exemplary transparent crucible. Point B is located at approximately between 1460° C. and 1465° C. At such a temperature, the corresponding relative graphite weight loss on the y-axis 204 is approximately 0.1 relative mass units. Thus, the reactivity ratio between the opaque crucible and the transparent crucible is approximately 40 fold. That is, with a reduction in temperature of the transparent crucible, the relative graphite weight lost in the reaction is 40 times less than the relative graphite weight loss using an opaque crucible. As such, in one embodiment, it is desirable for the transparent crucible to have an operational temperature during the crystal pulling process of less than 1500° C. More specifically, the transparent crucible has operational temperature within a range of approximately 1350° C. to approximately 1500° C., and even more specifically of between approximately 1450° C. and 1475° C.

Embodiments of the crystal growing systems described herein provide several advantages over known crystal growing systems. For example, the crystal growing systems of the present disclosure provide a substantially transparent crucible that has a reduced operational temperature during the crystal growing process. More specifically, the transparent crucible enables heat to be transmitted directly through the crucible rather than being absorbed therein, as is the case with an opaque crucible. As such, heat transfer to the melt is mostly by radiation through the transparent crucible. As such, the crucible reaches an operational temperature that is lower than a temperature of an opaque crucible. By reducing the temperature of the crucible 124, the reaction between the quartz crucible 124 and the graphite susceptor 102 slows, and, thus, fewer reaction products are formed by the reaction. As such, it is possible to suppress the formation of the gaseous components, thus reducing potential carbon contamination in the puller environment.

Another advantage of the crystal pulling system described herein is that the crucible maintains its transparency during operation of the crystal pulling system to continuously suppress formation of the gaseous contaminants.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", "down", "up", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A method of growing a crystal ingot from a melt, the method comprising:
   providing a susceptor and a crucible assembly, the crucible assembly comprising a crucible and a plurality of weirs;
   supporting the crucible with the susceptor, the crucible configured to contain the melt, wherein the crucible is substantially transparent; and
   generating thermal energy via a heating system and supplying the thermal energy to the susceptor via thermal radiation,
   the susceptor enabling transfer of thermal energy to the melt via radiation through the transparent crucible wherein a percent of the total thermal radiation supplied to the susceptor and transferred through the crucible is between approximately 80% and approximately 92%, each weir being substantially transparent such that a percent of the total thermal radiation transferred through the plurality of weirs is between approximately 80% and approximately 92%.

2. The method of claim 1, wherein the crucible remains transparent during the entire ingot growth cycle.

3. The method of claim 1, wherein at least a portion of the crucible includes an anti-reflective coating configured to facilitate transmission of thermal radiation through the crucible.

4. The method of claim 1, wherein a percent of the total thermal radiation supplied to the susceptor and transferred through the crucible is between approximately 90% and approximately 92%.

5. The method of claim 1, wherein the susceptor includes graphite and the crucible includes quartz.

6. The method of claim 1, wherein generating thermal energy includes generating thermal energy such that the crucible reaches a maximum operational temperature between approximately 1350 degrees Celsius (° C.) and approximately 1500° C.

7. The method of claim 6, wherein generating thermal energy includes generating thermal energy such that the crucible reaches a maximum operational temperature between approximately 1450° C. and approximately 1475° C.

* * * * *